United States Patent [19]
Sim

[11] Patent Number: 5,946,243
[45] Date of Patent: Aug. 31, 1999

[54] SIGNAL LINE DRIVING CIRCUITS WITH ACTIVE BODY PULL-UP CAPABILITY FOR REDUCING BOOST DELAY

[75] Inventor: Jai-Hoon Sim, Kyunggi-do, Rep. of Korea

[73] Assignee: Samsung Electronics Co., Ltd., Rep. of Korea

[21] Appl. No.: 09/085,569

[22] Filed: May 27, 1998

[30] Foreign Application Priority Data

May 27, 1997 [KR] Rep. of Korea ........................ 97-20830

[51] Int. Cl.[6] ........................................................ G11C 7/00
[52] U.S. Cl. .................................. 365/189.11; 365/230.06
[58] Field of Search ........................... 365/189.11, 230.06

[56] References Cited

U.S. PATENT DOCUMENTS

| 5,265,052 | 11/1993 | D'Arrigo et al. | 365/189.09 |
| 5,295,106 | 3/1994 | Jinbo | 365/218 |
| 5,297,104 | 3/1994 | Nakashima | 365/230.06 |
| 5,467,032 | 11/1995 | Lee | 326/88 |
| 5,654,920 | 8/1997 | Watsuji et al. | 365/185.27 |

Primary Examiner—David Nelms
Assistant Examiner—Hoai V. Ho
Attorney, Agent, or Firm—Myers Bigel Sibley & Sajovec

[57] ABSTRACT

Driving circuits with active body pull-capability for inhibiting boost delay include main, subordinate and boosted signal lines and a first driver circuit electrically coupled to the main signal line, to drive the main signal line at a first potential (e.g., Vcc). A second driver circuit, electrically coupled to the boosted signal line, is also provided to drive the boosted signal line at a second potential (e.g., Vpp) greater than the first potential. A first field effect transistor is provided as a pull-up transistor which has a gate, drain and source electrically coupled to the main signal line, the boosted signal line and the subordinate signal line, respectively. To reduce body-bias effects which might inhibit the speed and pull-up capability of the pull-up transistor, a second field effect transistor is provided to actively pull-up the body (e.g., active region) of the pull-up transistor. This second field effect has a gate, drain and source electrically coupled to the main signal line (or boosted signal line), the boosted signal line and the body of the pull-up transistor, respectively. The second field effect transistor is designed to provide a pull-up function to the body of the pull-up transistor so that the magnitude of the reverse bias between an inversion layer channel (e.g., N-type) and the body region (e.g., P-type) of the pull-up transistor is reduced when the pull-up transistor is turned on to provide a voltage boost to the subordinate signal line. This reduction in the reverse bias results in a reduction of the body-bias effect and the increase in threshold voltage typically associated with the body-bias effect.

20 Claims, 8 Drawing Sheets

SIGNAL LINE DRIVING CIRCUITS WITH ACTIVE BODY PULL-UP CAPABILITY FOR REDUCING BOOST DELAY

FIELD OF THE INVENTION

The present invention relates to integrated circuit semiconductor devices, and more particularly to integrated circuit semiconductor devices which utilize boosted voltage levels to drive signal lines therein.

BACKGROUND OF THE INVENTION

Integrated circuits which utilize low voltage power supplies to reduce power consumption may require internal voltage boosting circuits to improve performance. These internal voltage boosting circuits typically generate signals at potentials which exceed the voltage level (Vcc) of the power being supplied to the integrated circuit. For example, in high capacity integrated circuit memory devices, such as dynamic random access memory (DRAM) devices which utilize low voltage power supplies, it has typically been necessary to utilize word line driver circuits to internally generate boosted voltage signals at potentials in excess of Vcc. These boosted voltage signals are typically supplied to word lines of the memory device to improve the reliability of operations to write and read data to and from an array of memory cells in the device. Exemplary voltage boosting circuits are illustrated by U.S. Pat. No. 5,467,032 to Lee, entitled "Word Line Driver Circuit For A Semiconductor Memory Device", assigned to the present assignee, the disclosure of which is hereby incorporated herein by reference.

Referring now to FIG. 1, an electrical schematic of a conventional word line driver circuit is illustrated. FIG. 2 is a timing diagram which illustrates operation of the driver circuit of FIG. 1. In particular, a conventional word line driver circuit includes a row decoder 1 which receives a first address signal Ai and generates a decoded word line signal φS at an output thereof which is connected to a main word line MWL. A word line drive decoder 2 is also provided. The word line drive decoder 2 receives and decodes a second address signal Aj and generates true and complementary word line boost signals φXi and $\overline{\phi Xi}$. As illustrated by FIG. 2, the word line boost signal φXi may be provided as a boosted voltage signal having a magnitude of Vpp which is greater than Vcc. A pull-up driver 3 is also provided to boost a word line signal on a subordinate "sub" word line SWL which is electrically coupled to the main word line MWL, as illustrated. This sub word line may be electrically coupled to a portion of a row of memory cells in a memory array. Each of these memory cells may include an access transistor Tr having a drain electrically connected to a respective bit line BI and a source electrically connected to an electrode of a respective storage capacitor C, as illustrated.

Operation of the word line driver circuit of FIG. 1 will now be described with respect to FIG. 2. In particular, during an inactive state, the word line drive decoder 2 generates a word line boost signal φXi at a logic 0 potential and generates a complementary word line boost signal $\overline{\phi Xi}$ at a logic 1 potential. The generation of these signals causes NMOS transistor M3 to be turned off (thereby electrically disconnecting the main word line MWL from the sub word line SWL) and NMOS transistor M4 to be turned on to thereby pull the sub word line SWL down to a ground reference potential (GND). The main word line MWL can then be driven to a logic 1 potential (e.g., Vcc) by the row decoder 1. This will cause the first node N1 to be driven to Vcc and the second node N2 to be driven to Vcc-Vth1, where Vth1 is the threshold voltage of NMOS transistor M1.

Next, the word line boost signal φXi is driven to a boosted voltage $V_{\phi Xi}$ ($V_{\phi Xi}$=Vpp). In particular, this boosted voltage level $V_{\phi Xi}$ should be greater than Vcc by at least Vth2, where Vth2 is the threshold voltage of NMOS transistor M2. This causes NMOS transistor M3 to turn on and the fourth node N4 to be driven to Vpp. This also causes NMOS transistor M4 to be turned off. When NMOS transistor M3 turns on, the potential of the first node N1 is passed to the third node N3 at the sub word line SWL. Thus, the sub word line SWL can be driven to a logic 1 potential by the main word line MWL (e.g., Vcc-Vth3) once the word line boost signal φXi has been generated. As will be understood by those skilled in the art, the receipt of a boosted voltage $V_{\phi Xi}$ at the fourth node N4 (drain of NMOS transistor M2) will also cause the second node N2 (i.e., the gate of NMOS transistor M2) to be boosted to a voltage having a magnitude equal to Vcc-Vth1+ $\alpha V_{\phi Xi}$. This boosting effect is a result of a "self-boosting" phenomenon which is caused by the presence of gate-to-drain capacitance $C_{gd}$ in NMOS transistor M2. The magnitude of this self-boosting effect is proportional to α, where α represents a self-boosting ratio. As will be understood by those skilled in the art, this self-boosting effect permits the word line boost signal φXi to initially pass through the inversion-layer channel formed in the body region of NMOS transistor M2 without any appreciable voltage drop. Thus, the full potential of the word line boost signal φXi can essentially be passed to the third node N3 at the sub word line SWL without initially incurring a voltage drop of Vth2.

However, as the potential of the sub word line SWL is increased in the delay time period $T_D$, as illustrated by FIG. 2, the effective threshold voltage Vth2 of the pull-up NMOS transistor M2 increases in response to a body-bias effect. The body-bias effect is caused by an increase in the reverse bias across the P-N junction formed between the inversion-layer channel and the body region of the NMOS transistor M2. Accordingly, the current driving capability of the NMOS transistor M2 decreases as the potential of the sub word line SWL increases. This decrease in current drive capability typically causes the delay time period $T_D$ associated with the transfer of the boost signal φXi to the sub word line SWL to increase. Accordingly, the voltage boosting capability of the word line driver circuit of FIG. 1 may be degraded by the body-bias effect and the access time associated with reading and writing data to the memory cell may be increased. This degradation in voltage boosting capability may become more severe as the voltage level of the power supply is decreased without a concomitant decrease in the threshold voltage of transistors in the driver circuits.

Thus, notwithstanding attempts to design word line driver circuits which provide voltage boosting capability, there continues to be a need for improved word line driver and related circuits which can provide enhanced voltage boosting capability even when operated at lower power supply voltages.

SUMMARY OF THE INVENTION

It is therefore an object of the present invention to provide improved circuits which are capable of driving signal lines with boosted voltages at high speed.

It is another object of the present invention to provide driving circuits which are capable of operating at low power supply voltages.

It is still another object of the present invention to provide driving circuits which are less susceptible to parasitics such as body-bias effects.

These and other objects, advantages and features of the present invention are provided by driving circuits which provide boosted voltage levels to signal lines with reduced susceptibility to parasitic delay caused by body-bias effects. According to one embodiment of the present invention, a first preferred driving circuit contains main, subordinate and boosted signal lines and means, electrically coupled to the main signal line, for driving the main signal line at a first potential (e.g., Vcc). Means, electrically coupled to the boosted signal line, is also provided for driving the boosted signal line at a second potential (e.g., Vpp) greater than the first potential. A first field effect transistor is also preferably provided as a pull-up transistor which has a gate, drain and source electrically coupled to the main signal line, the boosted signal line and the subordinate signal line, respectively. However, to reduce body-bias effects which might inhibit the speed and pull-up capability of the pull-up transistor, a second field effect transistor is provided to actively pull-up the body (e.g., active region) of the pull-up transistor. This second field effect transistor is preferably designed to have a gate, drain and source electrically coupled to the main signal line (or boosted signal line), the boosted signal line and the body of the pull-up transistor, respectively. In particular, the second field effect transistor is designed to provide a pull-up function to the body of the pull-up transistor so that the magnitude of the reverse bias between an inversion layer channel (e.g., N-type) and the body region (e.g., P-type) of the pull-up transistor is reduced when the pull-up transistor is turned on to provide a voltage boost to the subordinate signal line. This reduction in the reverse bias results in a reduction of the body-bias effect and the increase in threshold voltage typically associated with the body-bias effect.

DESCRIPTION OF THE PREFERRED EMBODIMENT

The present invention now will be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. It will also be understood that when a layer is referred to as being "on" another layer or substrate, it can be directly on the other layer or substrate, or intervening layers may also be present. In addition, the terms "first conductivity type" and "second conductivity type" refer to opposite conductivity types and each embodiment described herein includes a complementary embodiment as well. Moreover, although voltage signals are described hereinbelow as being positive relative to a ground reference potential (GND) and as being "greater" or "less" than another voltage (s), it will be understood by those skilled in the art that such references can be interpreted as magnitudes of voltages in the event negative power supply, signal line and threshold voltages are utilized. Like numbers refer to like elements throughout.

Figure 5:
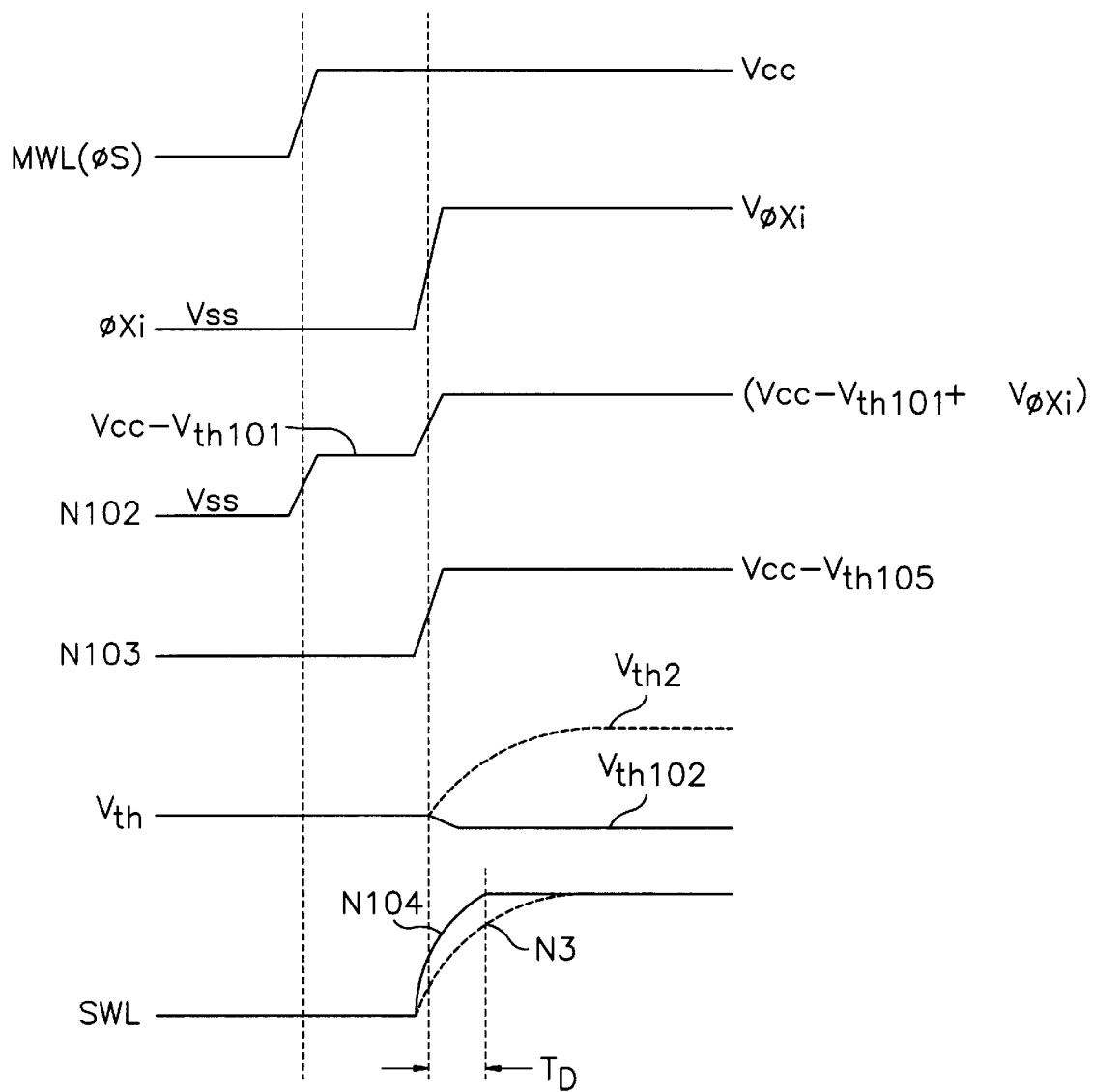
FIG. 5 is a timing diagram which illustrates operation of the driver circuit of FIG. 3.

Referring now to the electrical schematic of FIGS. 3 and 6–8 and the timing diagram of FIG. 5, preferred embodiments of the present invention will be described. In particular, a preferred word line driver circuit includes a row decoder 101 which receives a first address signal Ai and generates a decoded word line signal φS at a first potential (e.g., Vcc) at an output thereof which is connected to a main word line MWL. A word line drive decoder 102 is also provided. The word line drive decoder 102 receives and decodes a second address signal Aj and generates true and complementary word line boost signals φXi and $\overline{\phi Xi}$. As illustrated by FIG. 5, the word line boost signal φXi may be provided as a boosted voltage signal at a second potential of Vpp which is greater than Vcc. A preferred pull-up driver 103 is also provided to boost a word line signal applied to the subordinate "sub" word line SWL by the row decoder 101. This sub word line SWL is electrically coupled to the main word line MWL at node N101 by NMOS transistor M103, as illustrated. The sub word line may also be electrically coupled to a row of memory cells (or portion thereof) in a memory array. Each of these memory cells may include an access transistor Tr having a drain electrically connected to a respective bit line BL and a source electrically connected to an electrode of a respective storage capacitor C, as illustrated.

During an inactive state, the word line drive decoder 102 generates a word line boost signal φXi at a logic 0 potential and generates a complementary word line boost signal $\overline{\phi Xi}$ at a logic 1 potential. The generation of these signals causes NMOS transistor M103 to be turned off (thereby electrically disconnecting the main word line MWL from the sub word line SWL) and NMOS transistor M104 to be turned on to thereby pull down the sub word line SWL and the fourth node N104 to a ground reference potential (GND). The main word line MWL can then be driven to a logic 1 potential (e.g., Vcc) by the row decoder 101. This will cause the first node N101 to be driven to Vcc and the second node N102 to be driven to Vcc-Vth101, where Vth101 is the threshold voltage of NMOS transistor M101 which has a gate electrode tied to Vcc.

Next, the word line boost signal φXi is driven to a boosted voltage $V_{\phi Xi}$ ($V_{\phi Xi}$=Vpp). In particular, this boosted voltage level $V_{\phi Xi}$ should be greater than Vcc by at least Vth102, where Vth102 is the threshold voltage of NMOS transistor M102. This causes NMOS transistor M103 to turn on and the fifth node N105 to be driven to Vpp. This also causes NMOS transistor M104 to be turned off because the complementary boost signal is set to a logic 0 potential. When NMOS transistor M103 turns on, the potential of the first node N101 is passed to the fourth node N104 at the sub word line SWL. Thus, the sub word line SWL can be driven to a logic 1 potential by the main word line MWL once the word line boost signal φXi has been generated.

As will be understood by those skilled in the art, the receipt of a boosted voltage $V_{\phi Xi}$ at the fifth node N105 (drain of NMOS transistor M102) will also cause the second node N102 (i.e., the gate of NMOS transistor M102) to be boosted to a voltage having a magnitude equal to Vcc-Vth1+ $\alpha V_{\phi Xi}$. This boosting effect is a result of a "self-boosting" phenomenon which is caused by the presence of gate-to-drain capacitance $C_{gd}$ in NMOS pull-up transistor M102. The magnitude of this self-boosting effect is proportional to α, where α represents a self-boosting ratio. As will be understood by those skilled in the art, this self-boosting effect permits the word line boost signal φXi to initially pass through the inversion-layer channel formed in the body region of NMOS transistor M102 without any appreciable voltage drop. Thus, the full potential of the word line boost signal φXi can essentially be passed to the fourth node N104 at the sub word line SWL without initially incurring a voltage drop of Vth102.

Moreover, to prevent the parasitic body-bias effect from increasing the threshold voltage Vth102 of NMOS pull-up transistor M102 and to shorten the time delay $T_D$, as illustrated by FIG. 5, the present invention includes a body pull-up transistor (e.g., NMOS transistor M105). This preferred body pull-up transistor includes a gate, drain and source electrically connected to the main word line (at node N101), the boosted signal line (at node N105) and the body region of the NMOS transistor M102 (at node N103), respectively. Accordingly, based on the preferred circuit configuration of the first embodiment of FIG. 3, the generation of a logic 1 signal at the main word line MWL will turn on the body pull-up transistor M105 and drive the body region of the NMOS pull-up transistor M102 at node N103 towards the potential of node N105. The direct electrical connection between the P-type body region of the pull-up transistor M102 and the N-type source of the body pull-up transistor M105 is also preferably provided by forming the source as an N-type region within the P-type body region of transistor M102 and shorting the source and body regions together using a metal strap.

Figure 1:
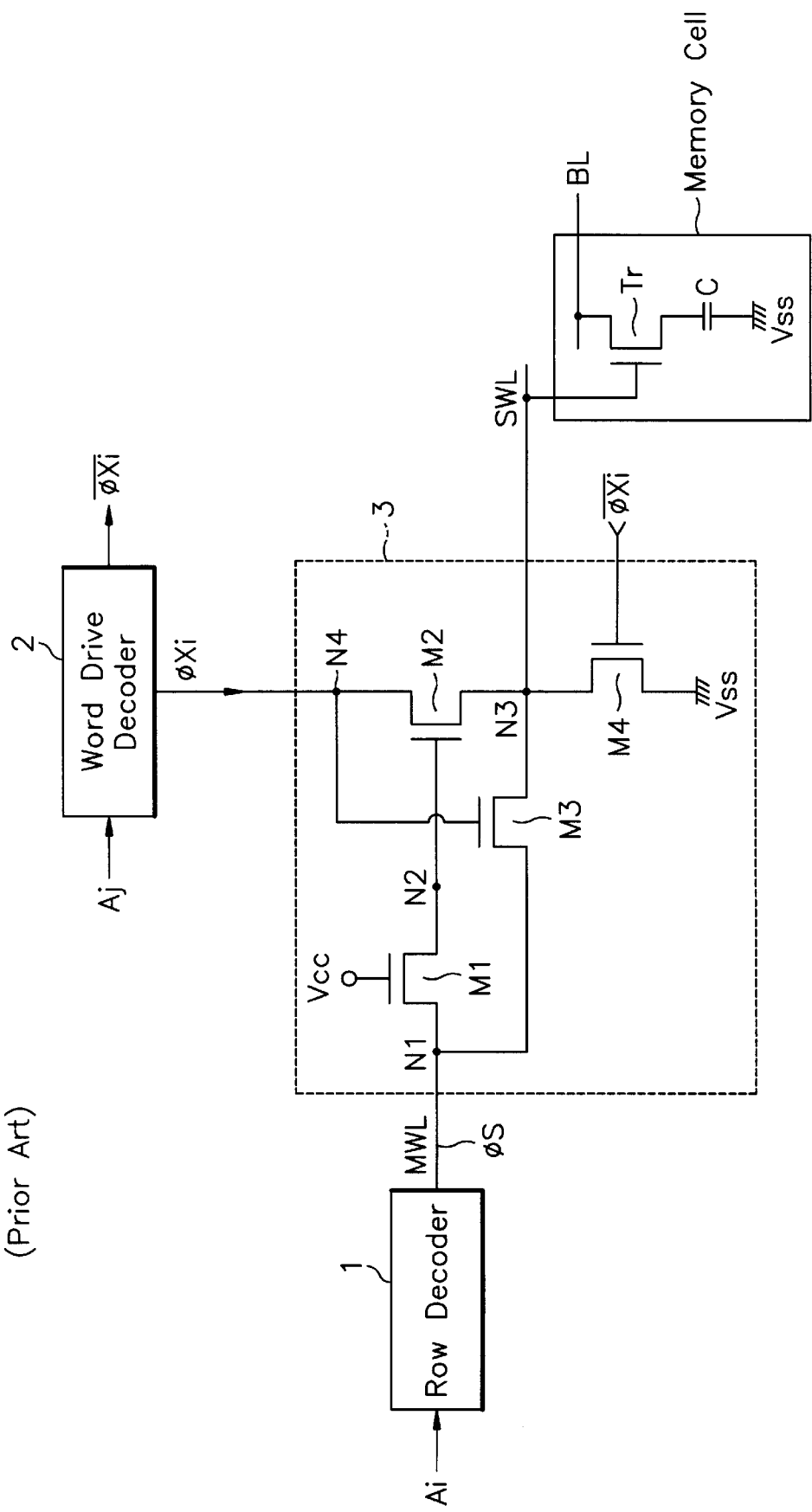
FIG. 1 is an electrical schematic of a sub word line driver circuit according to the prior art.
Figure 2:
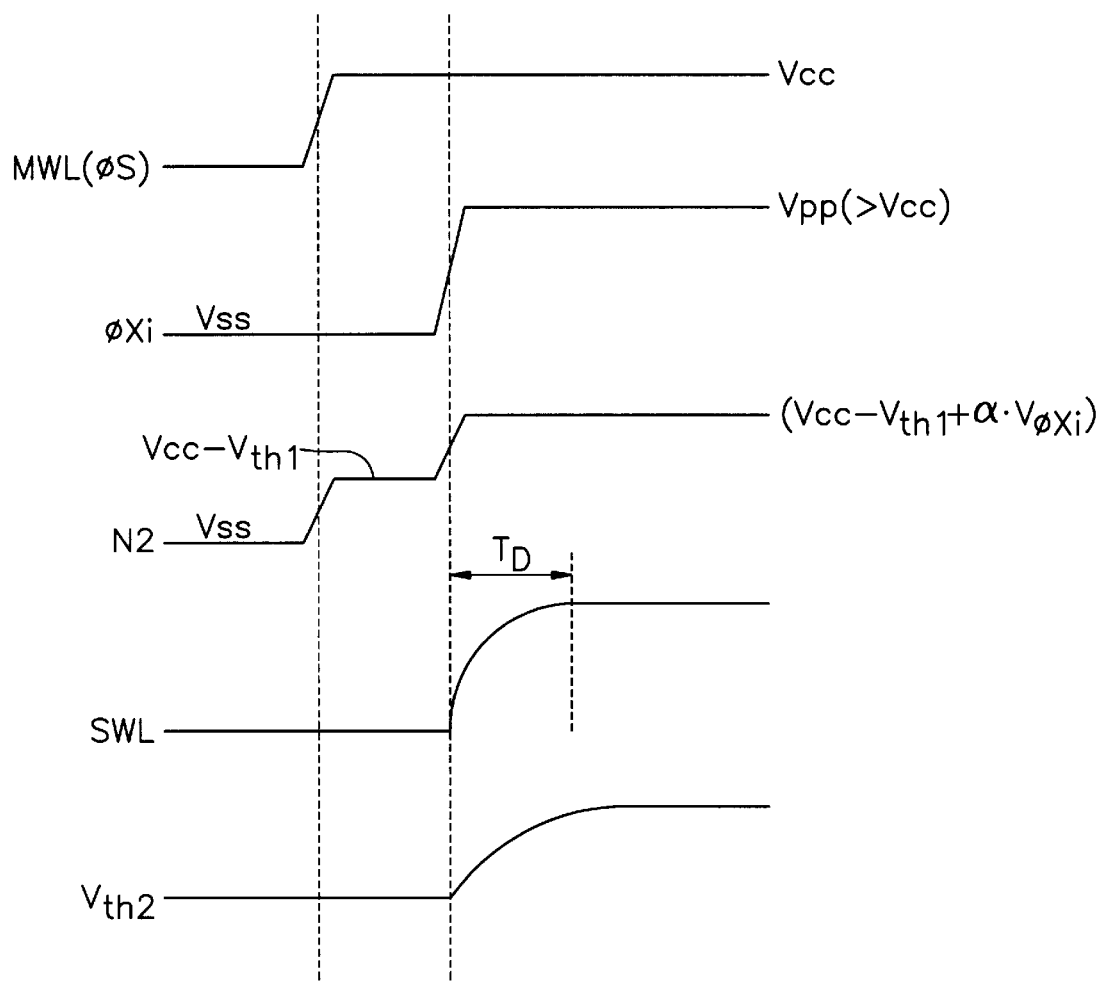
FIG. 2 is a timing diagram which illustrates operation of the driver circuit of FIG. 1.
Figure 3:
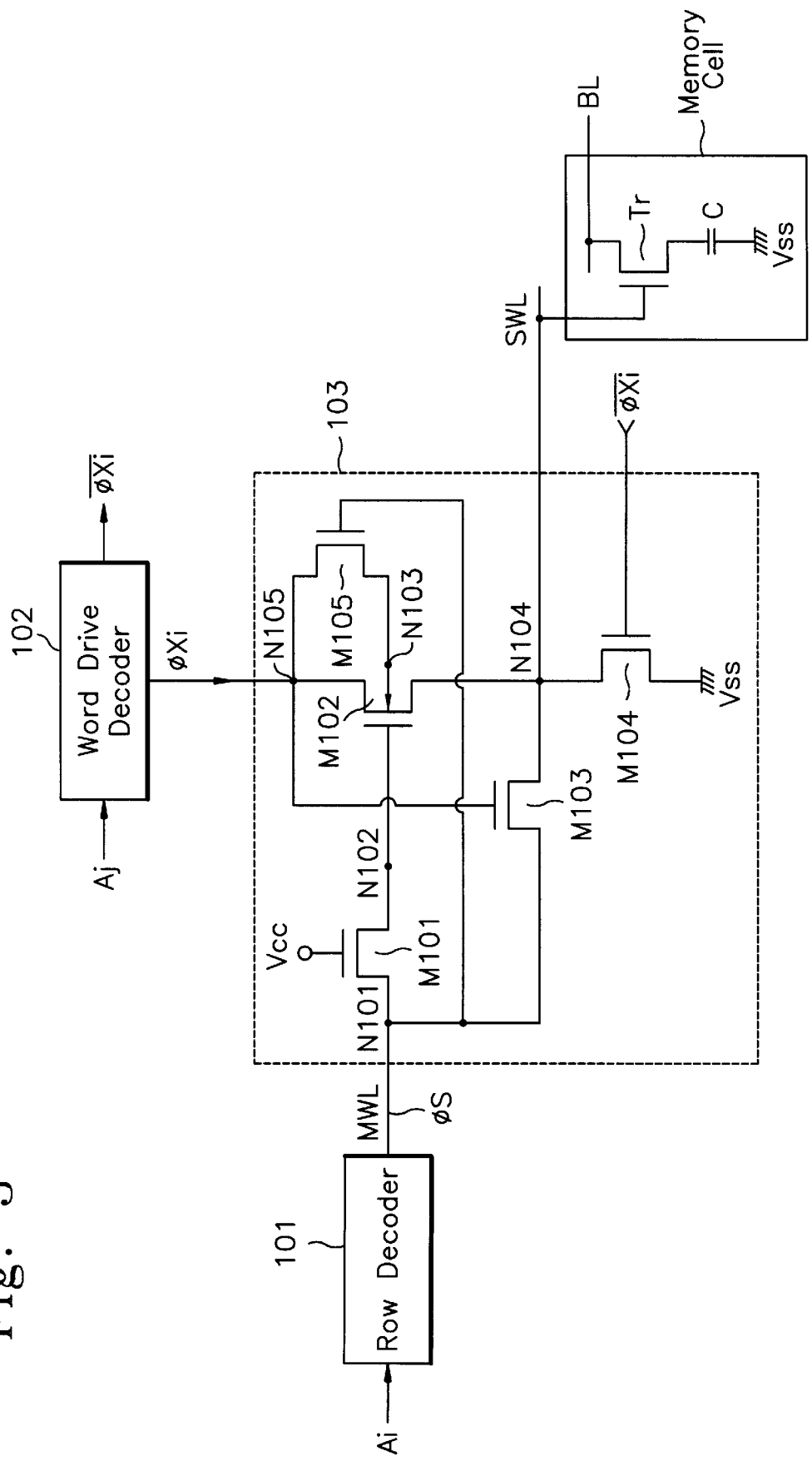
FIG. 3 is an electrical schematic of a preferred sub word line driver circuit according to a first embodiment of the present invention.
Figure 4:
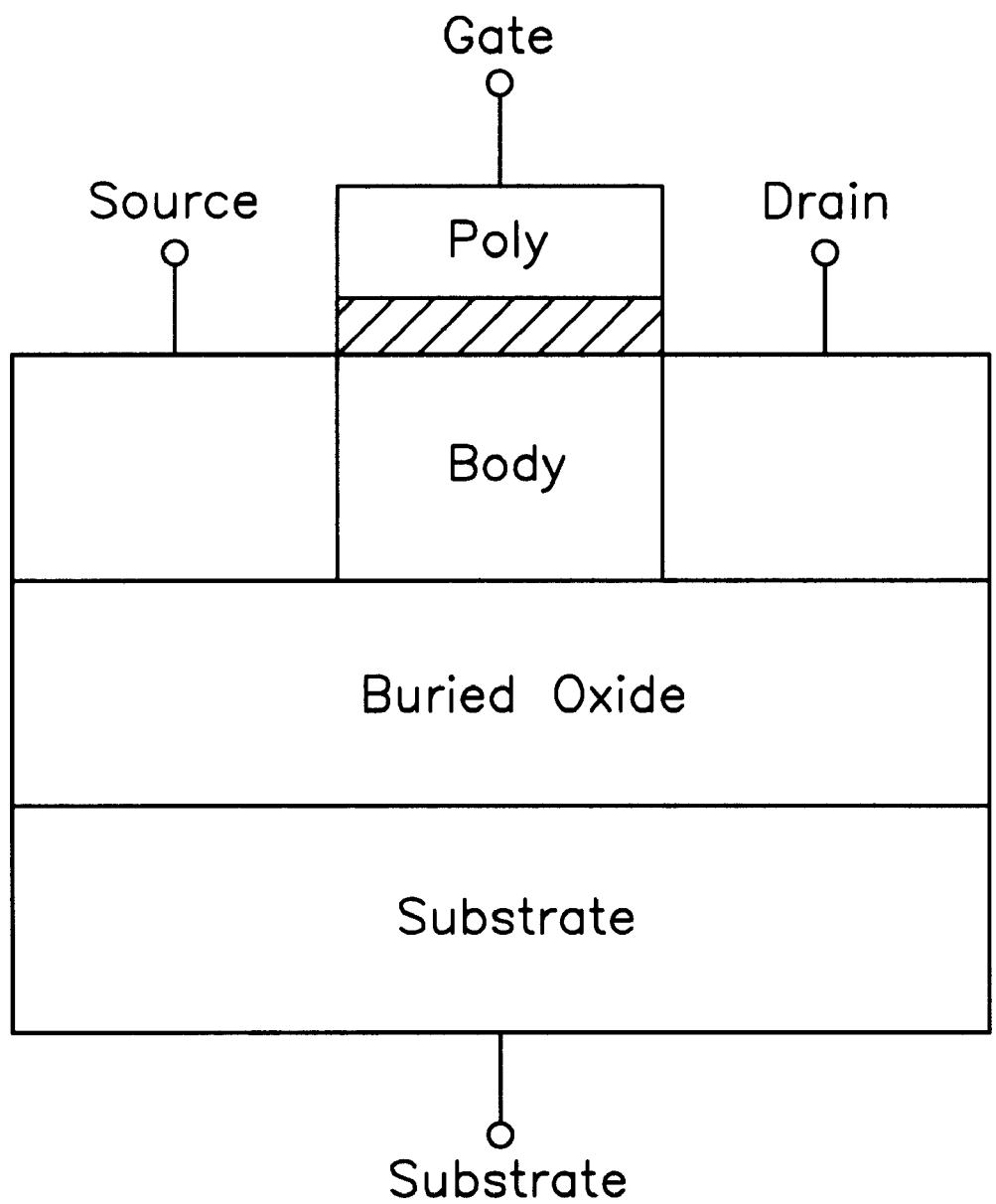
FIG. 4 is a cross-sectional view of an SOI field effect transistor which may used in the driver circuit of FIG. 3.

A timing comparison between the first embodiment of FIG. 3 and the conventional circuit of FIG. 1 is also provided by the solid and dotted lines in FIG. 5 which show a threshold voltage comparison between Vth102 and Vth2 and a sub word line voltage comparison between node N3 and node 104. Referring now to FIG. 4, the NMOS transistors illustrated in FIG. 3 may be formed on an silicon-on-insulator (SOI) substrate containing a substrate region, a buried oxide region and a semiconductor layer first conductivity type (e.g., P-type). Source and drain regions of second conductivity type (e.g., N-type) are also provided in the semiconductor layer and define a body region therebetween. An insulated gate electrode comprising polycrystalline silicon may also be formed on the semiconductor layer, opposite the body region.

Figure 6:
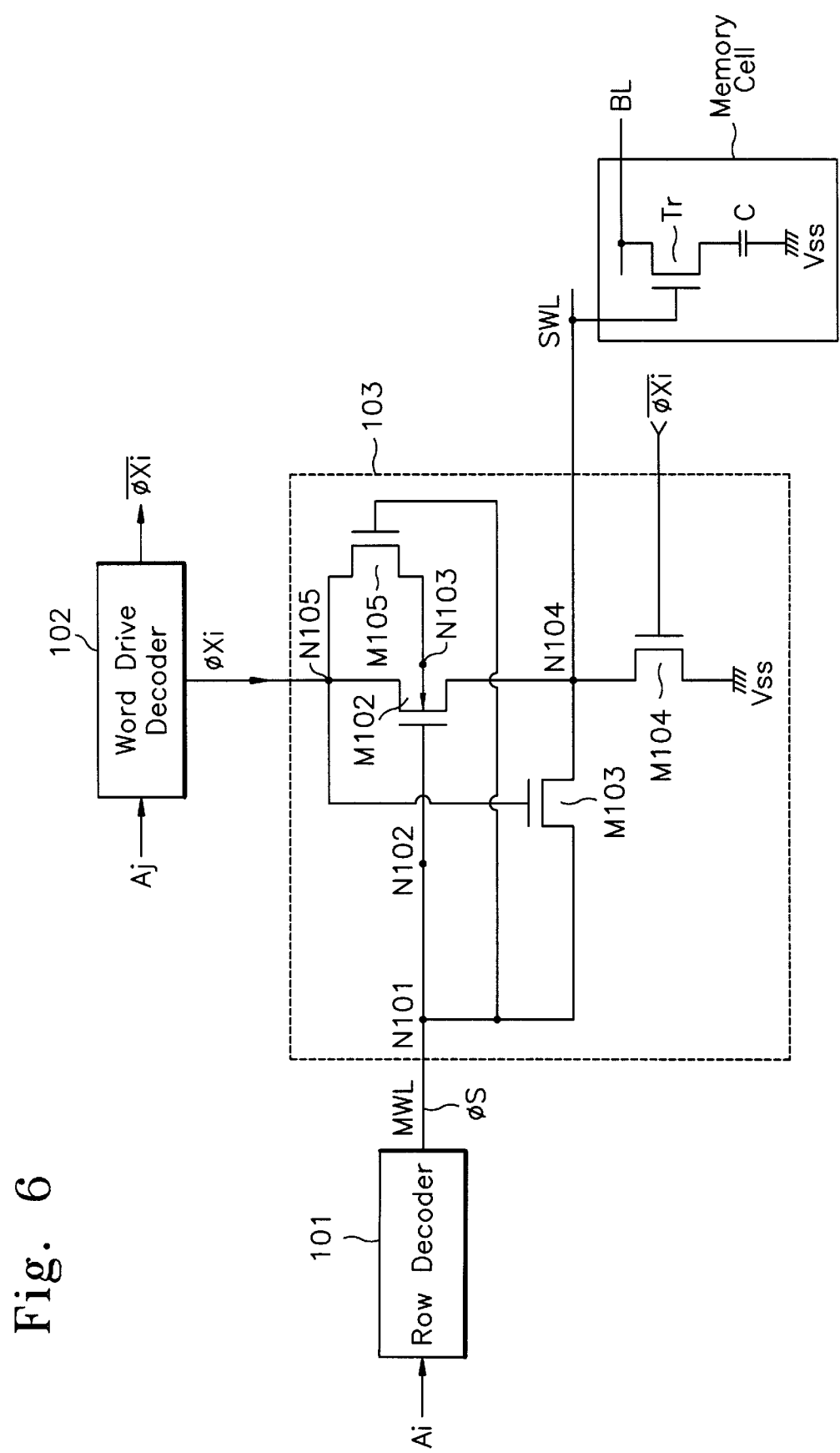
FIG. 6 is an electrical schematic of a preferred sub word line driver circuit according to a second embodiment of the present invention.
Figure 7:
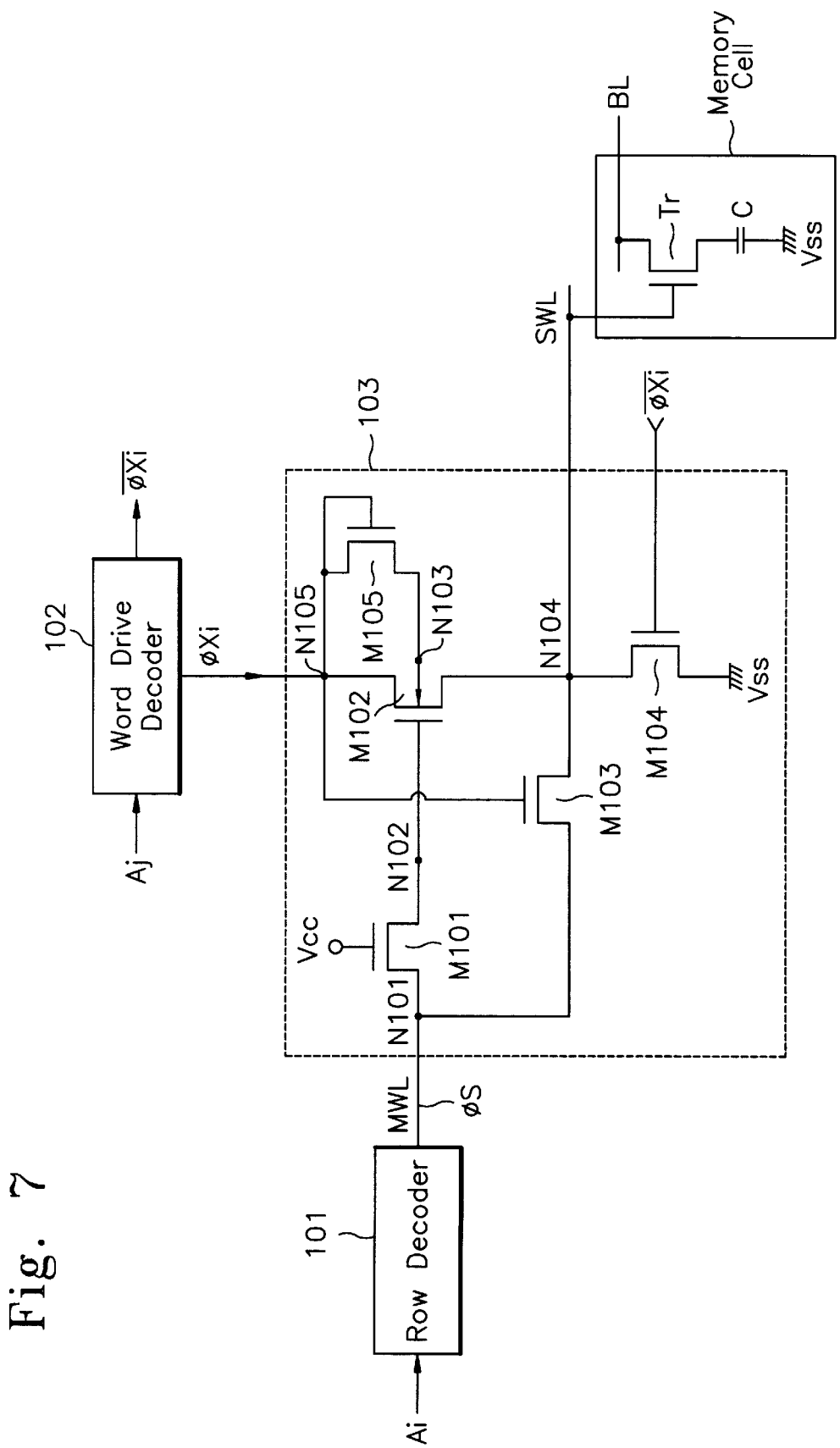
FIG. 7 is an electrical schematic of a preferred sub word line driver circuit according to a third embodiment of the present invention.
Figure 8:
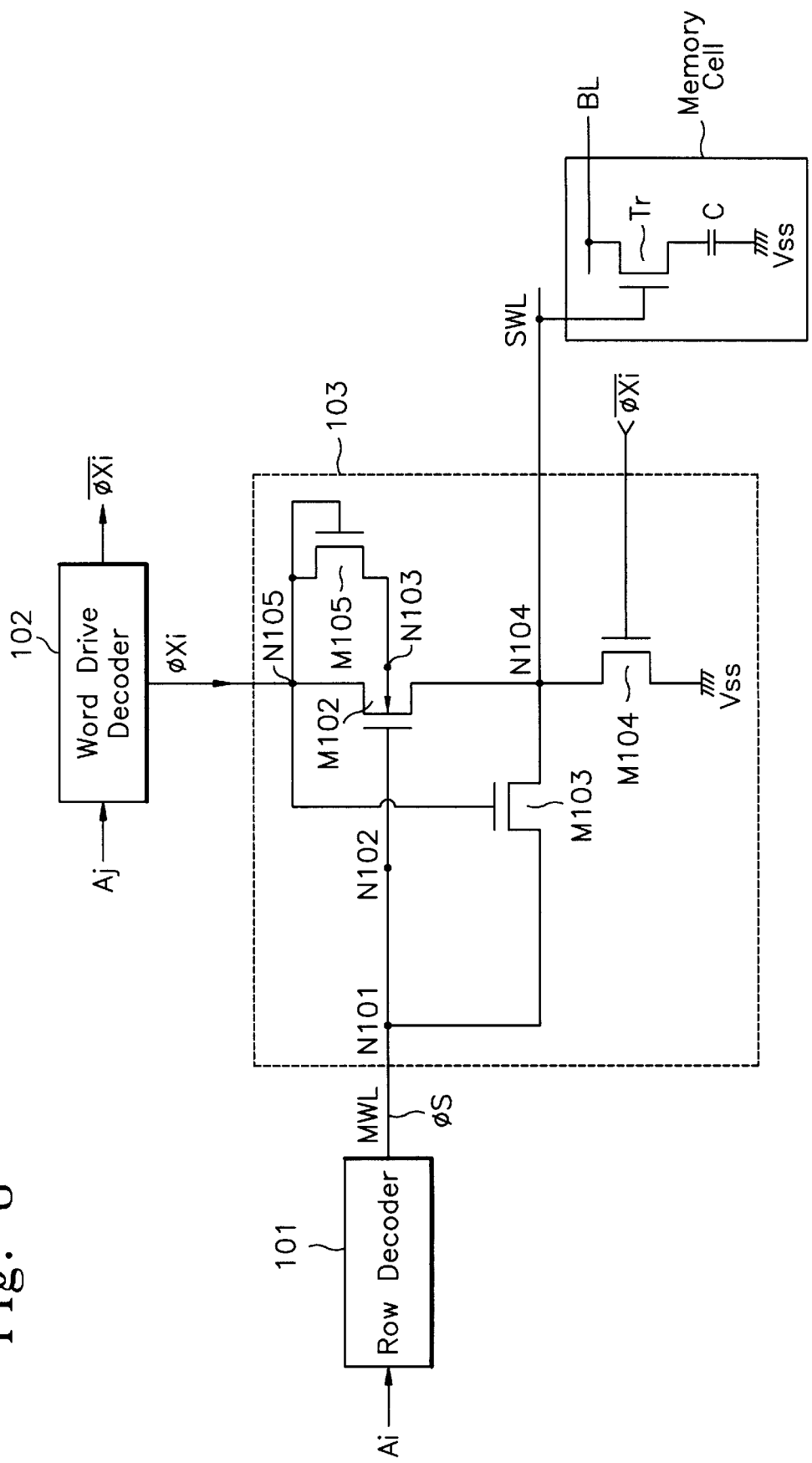
FIG. 8 is an electrical schematic of a preferred sub word line driver circuit according to a fourth embodiment of the present invention.

Alternative embodiments of the present invention are also illustrated by FIGS. 6–8. In particular, the drive circuit of FIG. 6 is similar to the drive circuit of FIG. 3, however NMOS transistor M101 is omitted. In the drive circuit of FIG. 7, the gate of the body pull-up transistor M105 is electrically connected to the fifth node N105, and in the drive circuit of FIG. 8, NMOS transistor M101 is omitted and the gate of the body pull-up transistor M105 is electrically connected to the fifth node N105.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. An integrated circuit, comprising:
   main, subordinate and boosted signal lines;
   means, electrically coupled to said main signal line, for driving said main signal line at a first potential;
   means, electrically coupled to said boosted signal line, for driving said boosted signal line at a second potential, greater than the first potential;
   a first field effect transistor having a gate, drain and source electrically coupled to said main signal line, said boosted signal line and said subordinate signal line, respectively; and
   a second field effect transistor having a gate electrically coupled to said main signal line or said boosted signal line, a drain electrically coupled to said boosted signal line and a source electrically coupled to a body region of said first field effect transistor.

2. The circuit of claim 1, further comprising:
   a first pass transistor electrically coupled in series between said main signal line and the gate of the first field effect transistor; and
   a second pass transistor electrically coupled in series between said main signal line and said subordinate signal line.

3. The circuit of claim 2, wherein said first pass transistor has a control electrode electrically connected to a power supply potential; and wherein said second pass transistor has a control electrode electrically connected to said boosted signal line.

4. The circuit of claim 2, further comprising a third pass transistor having a drain and source electrically coupled in series between said subordinate signal line and a ground reference potential.

5. The circuit of claim 4, wherein said means for driving said boosted signal line has an output electrically coupled to a control electrode of said third pass transistor.

6. The circuit of claim 1, further comprising a memory cell; and wherein a control electrode of said memory cell is electrically coupled to said subordinate signal line.

7. An integrated circuit memory device, comprising:
   main, subordinate and boosted word lines;
   a row decoder to drive said main word line with a word line signal at a first potential;
   means, electrically coupled to said boosted word line, for driving said boosted word line with a boost signal at a second potential, greater than the first potential;
   a word line pull-up transistor having a drain and source electrically connected in series between said boosted word line and said subordinate word line; and
   a body pull-up transistor having a gate, drain and source electrically coupled to said main word line, said boosted word line and a body region of said word line pull-up transistor, respectively.

8. The memory device of claim 7, further comprising:
   a first pass transistor having a source and drain electrically connected in series between said main word line and a gate of said word line pull-up transistor; and
   a second pass transistor having a source and drain electrically connected in series between said main word line and said subordinate word line.

9. The memory device of claim 8, further comprising a power supply line electrically connected to a gate of said first pass transistor.

10. The memory device of claim 9, wherein a gate of said second pass transistor is electrically connected to said boosted word line.

11. The memory device of claim 10, wherein said word line pull-up transistor is an NMOS transistor having a P-type body region; wherein said body pull-up transistor is an NMOS transistor; and wherein the source of said body pull-up transistor is shorted to the P-type body region.

12. The memory device of claim 11, where the source of said body pull-up transistor also forms a P-N junction with the P-type body region.

13. The memory device of claim 12, further comprising a memory cell having a control electrode electrically connected to said subordinate word line.

14. The memory device of claim 7, further comprising a memory cell having a control electrode electrically connected to said subordinate word line.

15. An integrated circuit, comprising:

main, subordinate and boosted signal lines;

means, electrically coupled to said main signal line, for driving said main signal line at a first potential;

means, electrically coupled to said boosted signal line, for driving said boosted signal line at a second potential, greater than the first potential;

a word line pull-up transistor having a gate, drain and source electrically coupled to said main signal line, said boosted signal line and said subordinate signal line, respectively; and means, coupled to said boosted signal line, for driving a body region of said word line pull-up transistor towards a potential of said boosted signal line when said main signal line and said boosted signal are driven to the first and second potentials, respectively.

16. The circuit of claim 15, wherein said means for driving a body region comprises a body pull-up transistor having a gate, drain and source electrically connected to one of said main and boosted signal lines, said boosted signal line and the body region of said word line field effect transistor, respectively.

17. The circuit of claim 15, further comprising:

a first pass transistor electrically coupled in series between said main signal line and the gate of said word line pull-up transistor; and a second pass transistor electrically coupled in series between said main signal line and said subordinate signal line.

18. The circuit of claim 17, wherein said first pass transistor has a control electrode electrically connected to a power supply potential; and wherein said second pass transistor has a control electrode electrically connected to said boosted signal line.

19. The circuit of claim 18, further comprising a third pass transistor having a drain and source electrically coupled in series between said subordinate signal line and a ground reference potential.

20. The circuit of claim 19, further comprising a plurality of memory cells having control electrodes electrically connected to said subordinate signal line.

* * * * *